(12) United States Patent
Cataldo et al.

(10) Patent No.: US 7,792,781 B2
(45) Date of Patent: Sep. 7, 2010

(54) FORM-BASED USER INTERFACE TOOL FOR SPECIFYING TIME-BASED, DISTRIBUTED ALGORITHMS FOR DISTRIBUTED SYSTEMS

(75) Inventors: James Adam Cataldo, San Jose, CA (US); Stanley T. Jefferson, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 706 days.

(21) Appl. No.: 11/692,071

(22) Filed: Mar. 27, 2007

(65) Prior Publication Data

US 2008/0243732 A1    Oct. 2, 2008

(51) Int. Cl.
*G06F 15/00* (2006.01)
*G06F 15/18* (2006.01)
(52) U.S. Cl. ....................................................... 706/62
(58) Field of Classification Search ..................... 706/62
See application file for complete search history.

(56) References Cited

U.S. PATENT DOCUMENTS 5,561,769 A * 10/1996 Kumar et al. ................ 709/202
6,345,240 B1 * 2/2002 Havens .......................... 703/21
7,284,208 B2 * 10/2007 Matthews ................... 715/854

OTHER PUBLICATIONS

An Adaptive Multi-Channel MAC Protocol with Dynamic Interval Division in Vehicular Environment, Liu, Liang; Xia, Weiwei; Shen, Lianfeng; Information Science and Engineering (ICISE), 2009 1st International Conference on Digital Object Identifier: 10.1109/ICISE.2009.226 Publication Year: 2009 , pp. 2534-2537.*
Interprocessor communication with limited memory, Pinar, A.; Hendrickson, B.; Parallel and Distributed Systems, IEEE Transactions on vol. 15 , Issue: 7 Digital Object Identifier: 10.1109/TPDS.2004.22 Publication Year: 2004 , pp. 606-616.*
Parallel parsing algorithms for static dictionary compression, Nagumo, H.; Mi Lu; Watson, K.L.; Parallel and Distributed Systems, IEEE Transactions on vol. 10 , Issue: 12 Digital Object Identifier: 10.1109/71.819946 Publication Year: 1999 , pp. 1241-1251.*
Spoken language recognition on a DSP array processor, Glinski, S.; Roe, D.; Parallel and Distributed Systems, IEEE Transactions on vol. 5 , Issue: 7 Digital Object Identifier: 10.1109/71.296316 Publication Year: 1994 , pp. 697-703.*
Agilent Technologies, Inc.—"Agilent TextExec SL 5.1 for Windows XP"—10 pages; http://www.home.agilent.com, dated Jul. 27, 2007.

* cited by examiner

*Primary Examiner*—Michael Holmes

(57) ABSTRACT

An apparatus for performing a distributed algorithm on a distributed system that comprises a plurality of components coupled together by a communication medium, comprises a user interface for permitting a user to enter a distributed algorithm specification that includes a time scale and tasks the components are to perform at specified times in the time scale; and a processor, coupled to receive the user-entered distributed algorithm specification and coupled to the distributed system on which the distributed algorithm is to be performed. The processor includes (i) a task generator for generating tasks for the respective components to perform according to a predetermined time line, and (ii) a distributor for distributing the tasks to the respective distributed system components. The respective distributed system components perform the distributed algorithm according to the distributed algorithm specification by (i) executing the respective tasks and (ii) communicating with each other over the communication medium.

20 Claims, 8 Drawing Sheets

FIG. 7

| Time | DUT | Scope | Arb |
|---|---|---|---|
|  | powerOn | init | init |
|  | init |  |  |
|  |  | prepareAcquisition | prepareBurst(5000kHz) |
| synchronized trigger |  | trigger | trigger |
|  |  | prepareAcquisition | prepareBurst(10000kHz) |
| synchronized trigger |  | trigger | trigger |
|  |  | prepareAcquisition | prepareBurst(15000kHz) |
| synchronized trigger |  | trigger | trigger |

FORM-BASED USER INTERFACE TOOL FOR SPECIFYING TIME-BASED, DISTRIBUTED ALGORITHMS FOR DISTRIBUTED SYSTEMS

BACKGROUND OF THE INVENTION

Embodiments of the invention relate to distributed systems made up, for instance, of multiple electronic instruments or other components, and to apparatus and methods for performing distributed algorithms, such as distributed test algorithms, on such systems.

In a typical scenario, a distributed algorithm for a distributed system involves multiple, electrically connected instruments, working together to perform the distributed algorithm, such as testing the performance of a network device or an avionics component. Each instrument's behavior in the distributed algorithm can be characterized as a sequence of tasks. Many of the tasks are time-sensitive, and the start time of one task on one instrument may depend on the start time of another task on another instrument. For example, a power supply may take some time to warm up to full power, so there may be a delay between when a power supply is turned on and when a switch is set to connect that power supply to a device under test.

SUMMARY OF THE INVENTION

An apparatus for performing a distributed algorithm on a distributed system that comprises a plurality of components coupled together by a communication medium, comprises a user interface for permitting a user to enter a distributed algorithm specification that includes a time scale and tasks the components are to perform at specified times in the time scale; and a processor, coupled to receive the user-entered distributed algorithm specification and coupled to the distributed system on which the distributed algorithm is to be performed. The processor includes (i) a task generator for generating tasks for the respective components to perform according to a predetermined time line, and (ii) a distributor for distributing the tasks to the respective distributed system components. The respective distributed system components perform a distributed algorithm according to the distributed algorithm specification by (i) executing the respective tasks and (ii) communicating with each other over the communication medium.

Further features and advantages of the present invention, as well as the structure and operation of preferred embodiments of the present invention, are described in detail below with reference to the accompanying exemplary drawings.

BRIEF DESCRIPTION OF THE DRAWINGS

FIGS. 5, 6, 7, and 8 are examples of user interface forms for embodiments of the invention.

DETAILED DESCRIPTION

Many types of distributed systems perform different kinds of distributed algorithms, as per their particular nature and purpose. The description which follows will focus primarily on the example of test systems and distributed algorithms for performing tests. However, it will be understood that other types of distributed systems and distributed algorithms may also employ or include embodiments of the invention described and claimed herein. Such other types of distributed systems include, for instance, industrial control, industrial automation, and control systems. Also, financial systems, for instance systems that handle events such as funds deposits, scheduled funds transfers, etc. may embody the invention.

Test sequencers, such as National Instruments' TestStand and Agilent Technologies' TestExec, attempt to reduce the difficulty of automating a test by allowing a user to specify a sequence of tasks on a set of instruments. While such tests may in many respects be easy to describe, implementing them with software is difficult and error prone. In particular, this conventional specification of a sequence does not include specifying a time sequence. Users specify a the relative ordering of measurement tasks ("first do A, then do B"), but they cannot specify the relative timing of these tasks ("begin B 100 ms after beginning A").

In many types of distributed system operations, the timing of tasks is critical. For instance, in a safety critical application, getting the timing right may be an important priority. If users want this sort of capability, they conventionally have had to achieve it with custom hardware and software.

Conventional software implementations, for instance, execute on their own, without reference to an externally specified time scale. Where timing information is specified in conventional manner, such as with software wait statements, there is no guarantee that real-time software execution will operate the hardware in a way that actually respects the specified time information.

In the standard implementation, all instruments involved in performing a distributed algorithm are controlled through a single processor, for instance, a personal computer (PC). This is inefficient, because if instrument A wishes to affect the state of instrument B, it must communicate through the PC. The PC may be operating according to latency times not allowed for by instrument A. For instance, time might be taken up because the IC is busy talking to instruments C, D, and E.

Also, the time between interactions may become nondeterministic; and may depend on network latencies, multitasking delays at the operating system level, and the amount of network traffic. Because of these factors, a conventional sequencer cannot provide relative timing of tasks according to a time scale.

Figure 1:
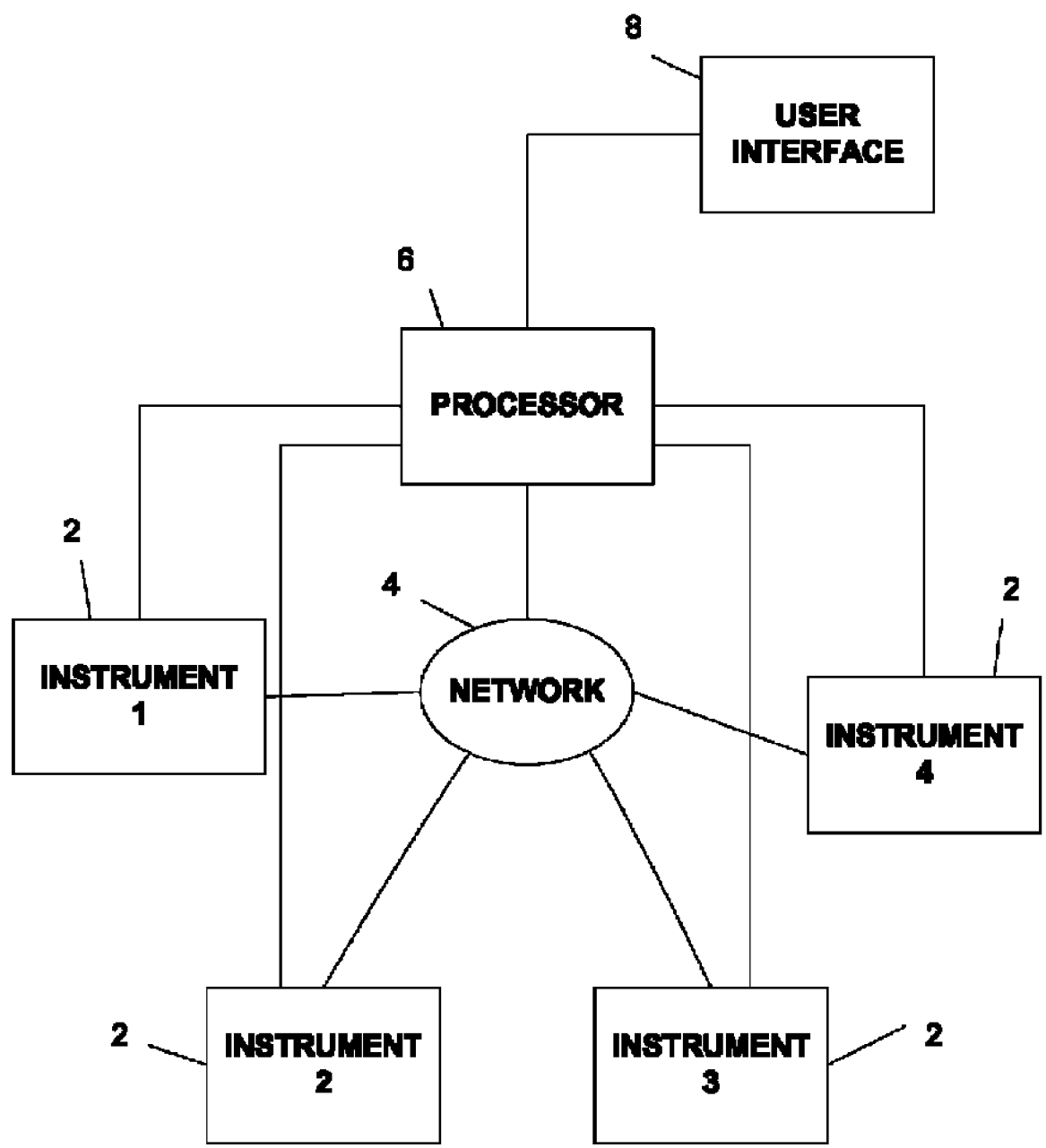
FIG. 1 is a block diagram of an apparatus and distributed system for performing a distributed algorithm.

FIG. 1 is a block diagram of a distributed system that includes several instruments 2 (labeled individually, for illustrative purposes, as "Instrument 1" through "Instrument 4") coupled to a network 4 for communication with each other. For performing a distributed algorithm (such as a distributed algorithm for testing) on the distributed system, a processor 6 is provided, being coupled for communication with the instruments 2 and with the network 4. A user interface 8 enables the user to input test specifications, commands, etc.

In an embodiment of the invention, a form-based tool is provided, for performing time-based tasks, that allow components to communicate more directly with one another via multicast messages.

To use this form-based tool, the user will specify the tasks in a distributed algorithm, and may specify the relative timing of time-critical tasks. The underlying tasks may be defined as a sequence of low-level instrument instructions, like SCPI commands, or using a higher-level programming environment, like MATLAB, LabVIEW, or C++. The user specifies the code or code location for each task. Such tasks may be specified in terms of software, firmware, or hardware.

A form-based tool makes it easy for users to perform distributed algorithms such as tests. The specification for a time-critical, distributed algorithm is easy to express with such a tool. The tool automates the process of generating instrument task instructions from a specification of the distributed system's behavior. It also frees the user from worrying about how to distribute interacting tasks on multiple machines; it does this automatically. When one instrument in a distributed system is swapped out with a new one, the overall specification remains the same. The tool simply maps the original specification to the new hardware. The resulting implementations are distributed, using multicast messages for instrument communication, and time synchronized with the user's specified timing behavior.

Figure 2:
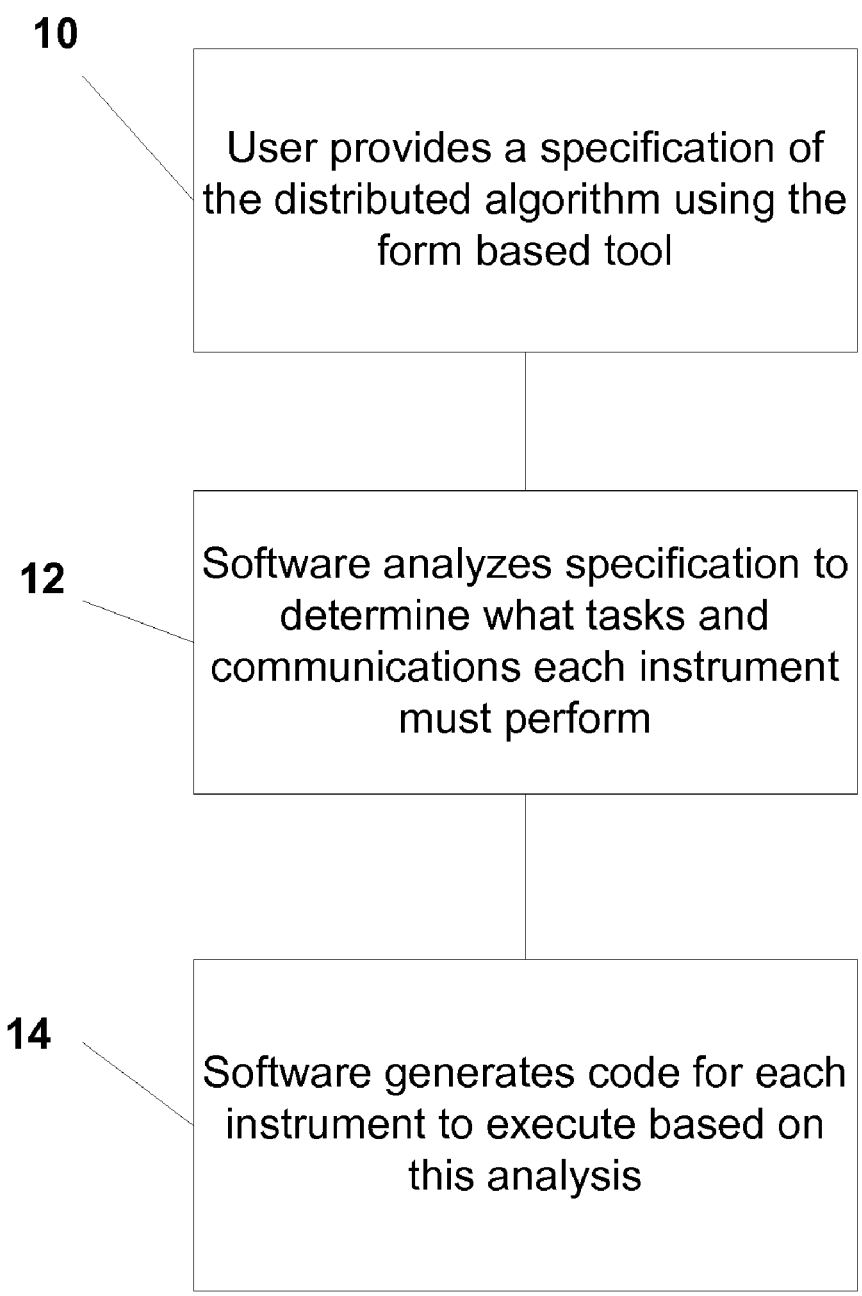
FIG. 2 is a flowchart of an embodiment of the invention.

FIG. 2 is a high-level flow chart showing operation of an apparatus, embodying the invention, for performing a distributed algorithm on a distributed system made up of a plurality of components (such as instruments), generally as shown In FIG. 1.

The user provides (10) a distributed algorithm specification (in this case a test specification) for testing the distributed system. The user may do so by entering the test specification, through the user interface 8 to the processor 6. Embodiments of the user interface will be described in detail below.

The processor 6 analyzes (12) the test specification, to determine what tasks and communications each instrument 2 of the distributed system must perform. The processor 6 may do so by executing a suitable software program. The software will analyze the user's specification to determine the set of possible tasks each instrument will perform, as well as which communications between instruments might occur during a test. This can be done with standard static analysis techniques used in programming language compilers.

The processor 6 generates (14) task instructions such as program instruction code, for each respective one of the instruments 2. The processor 6 provides the code to the respective instruments 2, for instance through the network 4 or through individual coupling links between the processor 6 and the respective instruments 2. A respective one of the instruments 2 will execute its respective program instruction code, in order to run the test. The code includes programming for execution at appropriate points in the time line.

Figure 3:
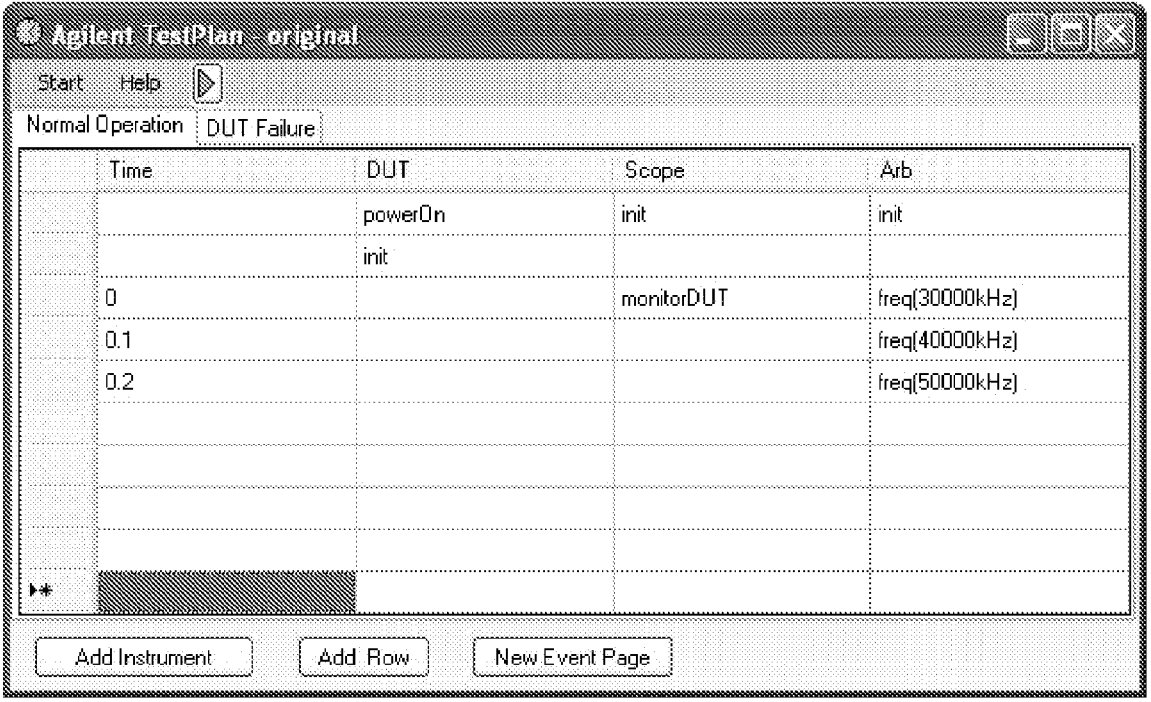
FIG. 3 is an example of a user interface form for embodiments of the invention.

FIG. 3 shows an example of a screen shot of a form-based tool in an embodiment of the invention, to be displayed on the user interface 8. In this example, the tool provides a window-type user interface that includes visually accessible specifications for the instruments in the distributed system to be tested, a time scale, actions to be performed by specified instruments at specified times according to the time scale, etc.

FIG. 3 will be described in terms of an exemplary distributed system whose architecture is shown as a block diagram in FIG. 4. In the distributed system of FIG. 4, there is a device under test "DUT" 16, an arbitrary waveform generator "arb" 18, a scope 20, and a power supply 22, coupled for operation through a network 24. The network 24 is represented schematically, and the details of the network connections between the illustrated components, while not shown, will be understood by those skilled in the art. The processor 6 and the user interface 8 are as described and shown in FIG. 1.

The form-based tool shown in the embodiment of FIG. 3 is in the form of a table made up of a two-dimensional array of cells arranged in rows and columns. A given column corresponds with a given instrument or other component. In the illustrated example, the distributed system includes three components, representing a distributed system in which (1) the device under test ("DUT") 16 is employed with (2) the piece of test equipment (designated "scope") 20 and (3) the function generator, here designated "Arb" for "arbitrary waveform generator" 18, an expression that is synonymous with "function generator."

Couplings between the column-referenced components (that is, the network 24 of FIG. 4) may be specified individually through the user interface. As an alternative, a general communication network coupled to all components may be employed. In such latter case, for instance, a Local Area Network address or the like may be specified for each component.

The user interface may allow the user to add or delete components as desired. For instance, the user can click a mouse button, etc., to add an instrument. The user will be prompted to specify the instrument, such as by the name and LAN address of the instrument. A new column will be displayed, with that instrument's name as the column heading.

A time scale is provided. For instance, one of the columns of the table of FIG. 3, headed "Time", includes specified time representations, one for each row or cells. The time can be a literal by-the-clock time, a relative time measured from an arbitrarily designated zero hour, an abstract time for specifying events in successive order with a predetermined real-time interval between each successively specified time, etc.

For each row, a cell is provided for each of the column-designated components. The user can define a task that a given component is to perform at a given time, by entering the task into the cell at the appropriate row and column. For instance, a given task software program, written to be executed by a given component at a given time, may be designated in the appropriate cell for that component at that time within the time line. The designation may include a cross-reference or pointer to a task software program stored in a storage medium (not shown), or may include all or part of the task software code itself, etc. Alternatively, the designation may specify a hardware action, such as a triggered data acquisition, a firmware or software action such as generation of FPGA code, etc. It will be understood, broadly, that other forms of tasks may also be used.

A user can click a button, shown as "Add Row," to add a row representing a time that occurs between the two times specified in the adjacent rows. A new row will then be displayed. The user may then specify one or more tasks to be performed by respective components at the newly specified time. The user enters a time in a cell in the time column, to specify the time at which all tasks entered in that row will be executed on the instruments that have specified tasks in that row. For instance, at the time 0, two tasks are simultaneously performed. The scope 20 performs a task "monitorDUT" to monitor the DUT 16, and the arb 18 performs a task "freq (30000 kHz)" to generate a signal of the specified frequency, for stimulating activity by the DUT 16 that the scope 20 will monitor. At the specified subsequent times 0.1 and 0.2, the arb 18 generates signals of other specified frequencies, for additional stimulation of the DUT 16.

In an embodiment, the user may specify, at a more general or even global level, a sequence of component tasks, conditions, etc., that occur in response to, are initiated by, or otherwise follow, a specified event. In such an embodiment of the invention, another type of graphical user interface page may be employed. This type of displayed user interface might be termed an "event page," in that it specifies tasks that are to be initiated upon the occurrence of the event, along with the sequencing, synchronization, and timing of those tasks.

Figure 5:
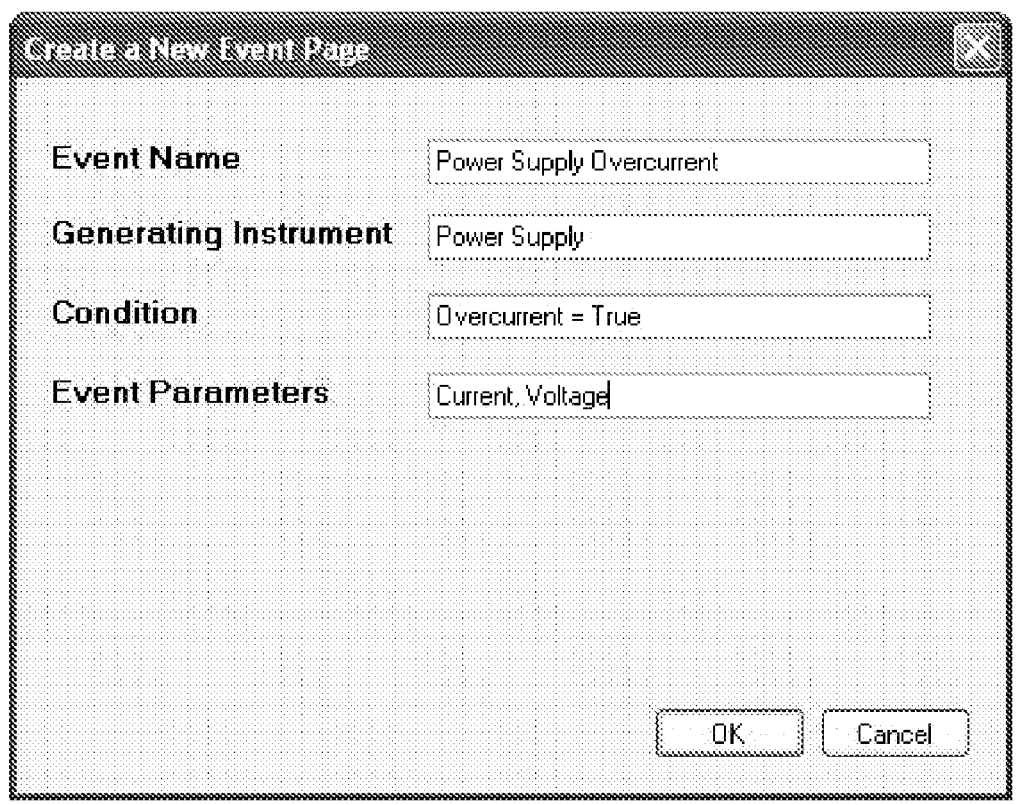

A user may add an event page by suitable user interface activity, such as clicking the "New Event Page" box in the screen shot of FIG. 3. FIG. 5 is an example of such a new event page dialog window that pops up when the user presses the new event page. The dialog window allows the user to input parameters such as the name of the event, the instrument that can generate the event, the condition on the instrument that will trigger the event, and any instrument parameters the generating instrument will send along with the message carrying the event.

In one embodiment, a graphical user interface provides separate visible pages for the various events which may be defined for the full operation of a distributed system. The user may select the page for an event the user wishes to review or modify. In one type of graphical interface, the pages may be shown with selectable tabs. For instance, the screen shot of FIG. 3 shows a window having two tabs at the top, labeled "Normal Operation" and "DUT Failure". The user may select either of these events for viewing, by clicking on the appropriate tab. Thus, the tab page is an example of an event page.

When the user finishes specifying parameters in the new event page dialog box of FIG. 5, for instance by clicking OK, a new tab page, comparable to that of FIG. 3, will be generated for this event. On this tab page, the user will specify how the instruments respond to this event, by entering times on the time scale, tasks the components are to perform, etc., as described above.

Figure 4:
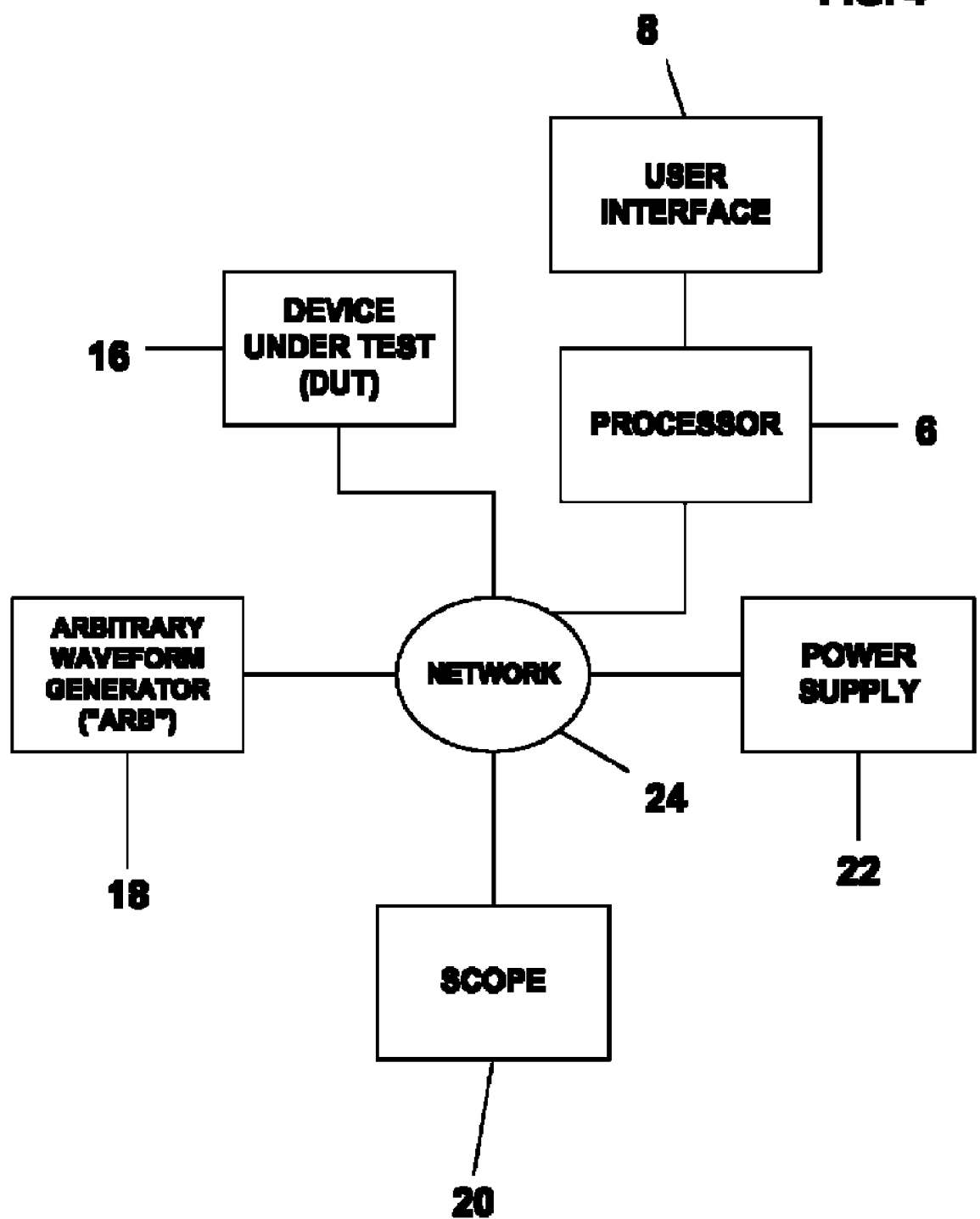
FIG. 4 is a block diagram of an apparatus and distributed system to for performing a distributed algorithm.
Figure 6:
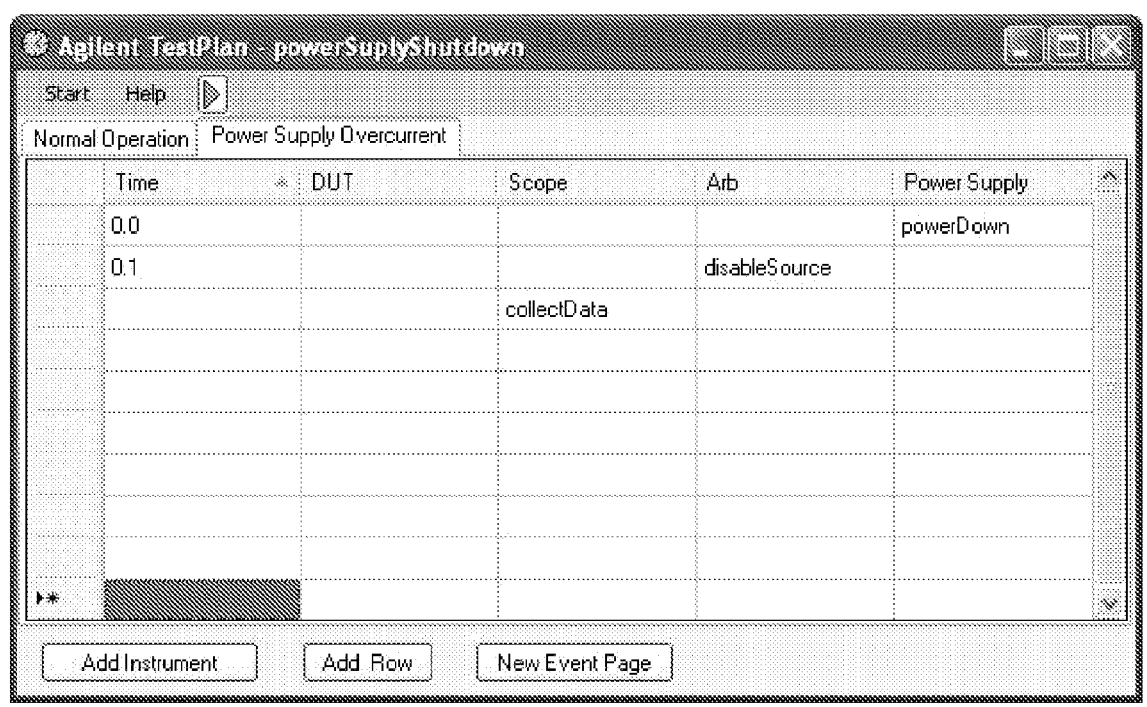
Figure 8:

Additional functions supported through the form-based user interface of an embodiment of the invention are illustrated, for the distributed system of FIG. 4, by the exemplary screen shots of FIGS. 6, 7, and 8.

In FIG. 6, an event called Power Supply Overcurrent, and the response to it, are shown as another graphical time-based test. This is the exemplary event that was entered into the dialog window of FIG. 5. An additional column, for the component "Power Supply," is shown. The power supply powers down at time 0.0. Then, the arbitrary function generator "Arb" executes a task to disables its signal source at a designated time 1.0. Afterward, at a time not specified but which occurs at a time after 1.0, how long afterward not critical, the Scope collects data which may be used, for instance, to diagnose the power loss or to observe and analyze the effects of the power loss.

In FIG. 7, the "arb" 18 and the scope 20 will perform a sequence of synchronized tasks. The time scale is specified in terms of events to take place simultaneously, without necessarily being at any particularly specified time. In this example, the scope 20 is made ready to make an acquisition, and the arbitrary waveform generator 18 is made ready to burst out a waveform. These are shown with the prepareAcquisition and prepareBurst commands in the respective columns, at a time prior to a synchronized trigger event. The two instruments agree on a time to trigger these measurement tasks, for instance by transmitting messages back and forth to one another. At the time of the "synchronized trigger" command in the time column, the events are triggered for simultaneous execution. Three such cycles of independent preparation, trigger time synchronization, and synchronized triggering are shown.

In FIG. 8, a test sequence similar to that of FIG. 3 is shown. However, in the case of FIG. 8, the time scale values specified in the Time column are not at regular intervals, so they make for non-uniform time intervals. As shown, the specified times for the listed component activities are at times 0, 0.1, and 0.1905, according to the time scale.

In some types of triggered events, such as those referred to above, the triggering event is anticipated to occur at some point in the future, and at that time will initiate some action, for instance a data acquisition. To prepare in advance for the future triggering event, a set-up task may be performed prior to the triggering event. The set-up task may, for instance, involve initializing or otherwise preparing hardware registers, configurations, etc. This may be implemented as follows: a task at time t may require code to be generated, that is executed at a time prior to t. That code sets up hardware or software mechanisms that respond efficiently and appropriately, at time t, to execute the specified task.

As discussed above, the term "event page" may refer to the user interface, such as the windows-type table shown in FIG. 3. More generally, however, the term "event page" may be used to describe a portion of the overall time line of the user's desired test distributed algorithm, for instance a portion in which a particular event of interest occurs. As shown in FIG. 3, the event page might be a portion of an overall time line, and thus might cover a succession of activities, pertaining to a specified event, over a contiguous portion of the time line.

For instance, a distributed algorithm might produce an intermediate result from one component, which is provided to another component to begin a subsequent phase of the distributed algorithm, provide intermediate results, etc. Where such a point in the distributed algorithm is of particular interest, the user interface might provide a separate event page starting with, or otherwise focused on, such a point in the distributed algorithm.

The user may manually enter a user interface command to create or define such an event page. For instance, the user can click a mouse button to add a new event page. The user will be prompted to enter a name for the event.

The user may also be prompted to enter a list of ways the event can be generated. Items in the list may, for instance, include:

The instrument that generates the event.

The condition on that instrument that causes the event to be triggered.

The parameters that are sent with the message generated by the event.

Whether or not the instruments should do anything in response to this event. This may a Boolean true/false value that is applicable globally to the distributed system as a whole. That is, if it is false, it means that all instruments should stop when receiving this event.

Additional user operations relating to the event page may be as follows: A new event tab page will be added to the current screen with the name of the event as the tab title. If a user clicks on this tab, an array of cells will appear, with the leftmost column being the time column and all other columns corresponding to instruments. The user can edit the cells as above to specify what to do in response to the event, should the message generating the event specify a response to the event is desired by providing a true value.

The processor 6 maps the user's specification into code generated for each instrument; the code runs in a distributed manner, with instruments communicating directly with one another, for instance via multicast messages. As defined in connection with the Internet Protocol (IP), multicast is the delivery of information to a group of destinations simultaneously, using the most efficient strategy to deliver the messages over each link of the network only once.

In an embodiment of the invention, this multicast capability enables the components 2 to communicate amongst themselves, without requiring centralized communication through the processor 6 and without requiring the processor 6 to govern all component tasks of the distributed algorithm by separately directing each task by each component 2.

An embodiment of the invention employs LXI Class B instruments, which can communicate over a local area network (LAN), and which can be easily programmed to react at specified times. When the instruments 2 are connected, they may automatically synchronize their clocks, often with such precision that clock discrepancies between instruments are in the nanosecond range. They can easily be programmed for transmission and response of multicast messages.

Some types of events, such as hardware triggers, etc., occur in a manner local to one component of a distributed system. Where a distributed algorithm is to be performed following occurrence of the event, the local component may communicate the occurrence of the event to the other components. Such communication may be specified, in the distributed algorithm, as one of the tasks the local component is to perform.

Other types of events involve the passage of time. For instance, in a previously executed portion of a distributed algorithm, a time interval may be specified. When that time interval has elapsed, the completion of the time interval is itself treated as another event, leading to another set of component tasks as another portion of the overall distributed algorithm. Any component that has its own clock can measure for itself when the time interval has elapsed. Thus, for such events, it may not be necessary for one of the components, acting as the event's local component, to communicate to the other components.

However, where such distributed system components maintain independent time clocks, and depend on those independent time clocks to know when a time interval has elapsed, there is a need to synchronize the clocks of the respective components. Such independent clocks may experience "clock drift," wherein over a period of time they gradually diverge from synchronization. Accordingly, the components of a distributed system may synchronize their clocks, for instance by periodically exchanging background messages containing their clocks' time during background activities that are not necessarily part of the distributed algorithm.

This interface allows users to specify the normal behavior of a distributed algorithm as well as the behavior in response to exceptional events. For instance, the user may wish to disconnect a device under test if an unexpected current spike is detected in a power supply. The test behavior in response to this event can be specified in an additional form, simplifying the user's view. The user specifies what code is used to monitor these special events.

In an embodiment of the invention, safety-critical applications may be performed. If any instrument in the distributed system changes, the new instrument's performance characteristics and software/hardware interface may be completely different from that of the previous component, even though its function is similar. Conventionally, such different instruments have been programmed individually, typically with low-level code specified in C/C++, requiring long development times. In an embodiment of the invention, such a change of instrument reduces the need for a rework of component software programming by the distributed system integrators.

Although the present invention has been described in detail with reference to particular embodiments, persons possessing ordinary skill in the art to which this invention pertains will appreciate that various modifications and enhancements may be made without departing from the spirit and scope of the claims that follow.

What is claimed is:

1. An apparatus for performing a distributed algorithm on a distributed system that comprises a plurality of components coupled together by a communication medium, the apparatus comprising:

a user interface for permitting a user to enter a distributed algorithm specification that includes a time scale and tasks the components are to perform at specified times in the time scale; and a processor, coupled to receive the user-entered distributed algorithm specification and coupled to the system on which the distributed algorithm is to be performed, the processor including (i) a task generator for generating tasks for the respective components to perform according to a predetermined time line, and (ii) a distributor for distributing the tasks to the respective distributed system components;

whereby the respective distributed system components perform the distributed algorithm according to the distributed algorithm specification by (i) executing the respective tasks and (ii) communicating with each other over the communication medium.

2. An apparatus as recited in claim 1, wherein the user interface permits the user to enter the distributed algorithm specification including specifications for (i) a time scale and the components, and (ii) tasks specified ones of the components are to perform at specified points in the time scale.

3. An apparatus as recited in claim 1 wherein the user interface includes a graphical user interface that permits the user to enter the distributed algorithm specification through a form-based tool.

4. An apparatus as recited in claim 2 wherein the user interface includes a graphical user interface that permits the user to enter the distributed algorithm specification through a form-based tool that includes a table having rows and columns that specify the time scale and the components, and having cells, each cell corresponding with a specified component and a specified point on the time scale, wherein a task specified within a given cell is to be performed by the specified component at the specified point in the time scale.

5. An apparatus as recited in claim 2 wherein one of the tasks is specified as one of (i) a software program to be executed by the specified component at the specified point on the time scale; (ii) firmware to be executed by the specified component at the specified point on the time scale; and (iii) a triggering event.

6. An apparatus as recited in claim 1 wherein:

the task generator includes a software generator for generating task software for respective ones of the distributed system components, the task software specifying the tasks for the respective distributed system components; and the distributor includes a software distributor for providing the task software to the respective distributed system components.

7. An apparatus as recited in claim 1, wherein the distributed algorithm specification includes:

(i) an event that may occur;

(ii) a time scale and the components, and (iii) tasks specified ones of the components are to perform at specified points in the time scale.

8. An apparatus as recited in claim 7, wherein the user interface permits the user to enter the distributed algorithm specification through a form-based tool, that includes specifications for a time scale and the components, and tasks specified ones of the components are to perform at specified points in the time scale, and that further includes (i) the event that may occur, and (ii) the task to be performed by a specified one of the components responsive to occurrence of the event.

9. A method for performing a distributed algorithm on a distributed system that comprises a plurality of components coupled together by a communication medium, the method comprising:
- providing a distributed algorithm specification to a processor, the distributed algorithm specification including a time scale and tasks the components are to perform at specified points in time within the time scale;
- analyzing the distributed algorithm specification to determine (i) what tasks each respective one of the plurality of components is to perform, (ii) times, according to the time scale, at which the respective components are to perform the tasks; and (iii) communications to take place between the components; and
- generating task instructions for respective ones of the components, the task instructions including tasks and times, according to the time scale, at which the tasks are to be performed; and
- distributing the task instructions to the respective components.

10. A method as recited in claim 9, wherein the providing the distributed algorithm specification includes using a graphical user interface to specify (i) the components, (ii) the times of the time scale, and (iii) the tasks.

11. A method as recited in claim 10, wherein:
- the graphical user interface includes a form-based tool; and
- the providing the distributed algorithm specification includes using a graphical user interface to specify (i) the components, (ii) the times of the time scale, and (iii) the tasks.

12. A method as recited in claim 9 wherein:
- the generating task instructions includes generating task software for respective ones of the distributed system components, the task software specifying the tasks for the respective distributed system components; and
- the distributing the task instructions includes providing the task software to the respective distributed system components.

13. A method as recited in claim 9, wherein the distributed algorithm specification includes:
- (i) an event that may occur;
- (ii) a time scale and the components, and
- (iii) tasks specified ones of the components are to perform at specified points in the time scale.

14. A method as recited in claim 13, wherein the user interface permits the user to enter the distributed algorithm specification through a form-based tool, that includes specifications for a time scale and the components, and tasks specified ones of the components are to perform at specified points in the time scale, and that further includes (i) the event that may occur, and (ii) the task to be performed by a specified one of the components responsive to occurrence of the event.

15. A computer program product for directing a processing apparatus to perform a distributed algorithm on a distributed system that comprises a plurality of components coupled together by a communication medium, the computer program product comprising:
- a computer-readable medium; and
- computer program code, provided on the computer-readable medium, for directing the processing apparatus to:
  - receive a distributed algorithm specification provided to a processor of the processing apparatus, the distributed algorithm specification including a time scale and tasks the components are to perform at specified points in time within the time scale;
  - analyze the distributed algorithm specification to determine (i) what tasks each respective one of the plurality of components is to perform, (ii) times, according to the time scale, at which the respective components are to perform the tasks; and (iii) communications to take place between the components; and
  - generate task instructions for respective ones of the components, the task instructions including tasks and times, according to the time scale, at which the tasks are to be performed; and
  - distribute the task instructions to the respective components.

16. A computer program product as recited in claim 15, wherein the computer program code includes computer program code for directing the processing apparatus to receive the distributed algorithm specification through a graphical user interface, in which the received distributed algorithm specification includes specifications of (i) the components, (ii) the times of the time scale, and (iii) the tasks.

17. A computer program product as recited in claim 16, wherein:
- the graphical user interface includes a form-based tool; and
- the computer program code includes computer program code for directing the processing apparatus to receive the distributed algorithm specification through a graphical user interface, in which the received distributed algorithm specification includes specifications of (i) the components, (ii) the times of the time scale, and (iii) the tasks.

18. A computer program product as recited in claim 15, wherein the computer program code includes computer program code for directing the processing apparatus:
- to generate task instructions by generating task software for respective ones of the distributed system components, the task software specifying the tasks for the respective distributed system components; and
- to distribute the task instructions by providing the task software to the respective distributed system components.

19. A computer program product as recited in claim 15, wherein the distributed algorithm specification includes:
- (i) an event that may occur;
- (ii) a time scale and the components, and
- (iii) tasks specified ones of the components are to perform at specified points in the time scale.

20. A computer program product as recited in claim 19, wherein the user interface permits the user to enter the distributed algorithm specification through a form-based tool, that includes specifications for a time scale and the components, and tasks specified ones of the components are to perform at specified points in the time scale, and that further includes (i) the event that may occur, and (ii) the task to be performed by a specified one of the components responsive to occurrence of the event.

* * * * *